(12) United States Patent
Wada et al.

(10) Patent No.: US 11,143,526 B2
(45) Date of Patent: Oct. 12, 2021

(54) CAPACITIVE SENSOR

(71) Applicant: ALPS ALPINE CO., LTD., Tokyo (JP)

(72) Inventors: Suguru Wada, Miyagi-ken (JP);
Tomoki Yamada, Miyagi-ken (JP);
Toru Takahashi, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 245 days.

(21) Appl. No.: 16/411,245

(22) Filed: May 14, 2019

(65) Prior Publication Data
US 2019/0265072 A1 Aug. 29, 2019

Related U.S. Application Data

(63) Continuation of application No. PCT/JP2017/037568, filed on Oct. 17, 2017.

(30) Foreign Application Priority Data

Nov. 14, 2016 (JP) .............................. JP2016-221224

(51) Int. Cl.
*G01D 5/24* (2006.01)
*G01V 3/08* (2006.01)
*H01H 36/00* (2006.01)

(52) U.S. Cl.
CPC ................. *G01D 5/24* (2013.01); *G01V 3/08* (2013.01); *H01H 36/00* (2013.01)

(58) Field of Classification Search
CPC ........... G01D 5/24; G01D 5/241; G01V 3/08; H01H 36/00; H03K 2217/94036; H03K 2217/960755; H03K 17/955
See application file for complete search history.

(56) References Cited

U.S. PATENT DOCUMENTS

| | | | |
|---|---|---|---|
| 2009/0135157 A1* | 5/2009 | Harley ................. | G06K 9/0002 345/174 |
| 2010/0073325 A1* | 3/2010 | Yang .................... | G06F 3/04166 345/174 |
| 2013/0081450 A1* | 4/2013 | Son ........................ | B01L 3/0241 73/64.56 |
| 2013/0234735 A1* | 9/2013 | Nakagawa ......... | G01R 27/2605 324/679 |

FOREIGN PATENT DOCUMENTS

JP 2010-223794 7/2010

* cited by examiner

*Primary Examiner* — Son T Le
(74) *Attorney, Agent, or Firm* — Hunton Andrews Kurth LLP

(57) ABSTRACT

A capacitive sensor has first electrodes, a second electrode, and a third electrode, which are disposed at places where a manipulating body that is part of a human body such as a finger is detected. The capacitive sensor also has a capacitance detecting means and a deciding means. The deciding means identifies the number of manipulating bodies and directions (positions) according to the capacitances of the first electrodes, second electrode, and third electrode.

13 Claims, 19 Drawing Sheets

| CA111 | 4 |
|---|---|
| CA112 | 3 |
| CA113 | 3 |
| CA114 | 4 |
| CA115 | 5 |
| CA116 | 10 |
| CA117 | 7 |
| CA118 | 5 |

| CA12 | 4 |
|---|---|
| CA13 | 7 |

| SUM | 52 |
|---|---|

| CA111 | 60 |
|---|---|
| CA112 | 10 |
| CA113 | 15 |
| CA114 | 90 |
| CA115 | 20 |
| CA116 | 75 |
| CA117 | 10 |
| CA118 | 60 |

| CA12 | 20 |
|---|---|
| CA13 | 30 |

| SUM | 400 |
|---|---|

FIG. 15A

| FIRST ELECTRODE | CAPACITANCE | CHECK | SELECTED ELECTRODE | MANIPULATING BODY | COORDINATE |
|---|---|---|---|---|---|
| 111 | 60 | | | | |
| 112 | 10 | DONE | | | |
| 113 | 15 | DONE | | | |
| 114 | 90 | | | | |
| 115 | 20 | DONE | | | |
| 116 | 75 | | | | |
| 117 | 10 | DONE | | | |
| 118 | 60 | | | | |

| FIRST ELECTRODE | CAPACITANCE | CHECK | SELECTED ELECTRODE | MANIPULATING BODY | COORDINATE |
|---|---|---|---|---|---|
| 111 | 60 | DONE | APPLICABLE | 1 | 0 |
| 112 | 10 | DONE | | | |
| 113 | 15 | DONE | | | |
| 114 | 90 | | | | |
| 115 | 20 | DONE | | | |
| 116 | 75 | | | | |
| 117 | 10 | DONE | | | |
| 118 | 60 | DONE | APPLICABLE | | |

FIG. 15C

| FIRST ELECTRODE | CAPACITANCE | CHECK | SELECTED ELECTRODE | MANIPULATING BODY | COORDINATE |
|---|---|---|---|---|---|
| 111 | 60 | DONE | | 1 | 0 |
| 112 | 10 | DONE | | 2 | 3.5 |
| 113 | 15 | DONE | | | |
| 114 | 90 | DONE | APPLICABLE | | |
| 115 | 20 | DONE | | | |
| 116 | 75 | | | | |
| 117 | 10 | DONE | | | |
| 118 | 60 | DONE | | | |

| FIRST ELECTRODE | CAPACITANCE | CHECK | SELECTED ELECTRODE | MANIPULATING BODY | COORDINATE |
|---|---|---|---|---|---|
| 111 | 60 | DONE | | 1 | 0 |
| 112 | 10 | DONE | | 2 | 3.5 |
| 113 | 15 | DONE | | 3 | 5.5 |
| 114 | 90 | DONE | | | |
| 115 | 20 | DONE | | | |
| 116 | 75 | DONE | APPLICABLE | | |
| 117 | 10 | DONE | | | |
| 118 | 60 | DONE | | | |

| CA111 | 10 |
|---|---|
| CA112 | 10 |
| CA113 | 40 |
| CA114 | 100 |
| CA115 | 50 |
| CA116 | 20 |
| CA117 | 60 |
| CA118 | 60 |

| CA12 | 300 |
|---|---|
| CA13 | 200 |

| SUM | 850 |
|---|---|

CAPACITIVE SENSOR

CLAIM OF PRIORITY

This application is a Continuation of International Application No. PCT/JP2017/037568 filed on Oct. 17, 2017, which claims benefit of Japanese Patent Application No. 2016-221224 filed on Nov. 14, 2016. The entire contents of each application noted above is incorporated herein by reference.

BACKGROUND OF THE INVENTION

1. Field of the Invention

The present invention relates to a capacitive sensor, and more particularly to a capacitive sensor that is useful as an input means for a vehicle, a mobile electronic device, or the like.

2. Description of the Related Art

As a proximity sensor that detects the proximity of a manipulating body, which is part of a human body such as a finger, there is a capacitive sensor that detects the proximity of a manipulating body according to changes in the capacitances of electrodes placed in a predetermined pattern.

The capacitive sensor disclosed in Japanese Unexamined Patent Application Publication No. 2010-223794 detects whether a manipulating body has approached, according to the capacitances of a plurality of hollow rectangular electrodes placed so as to have a common center.

SUMMARY OF THE INVENTION

However, the conventional capacitive sensor described above is problematic in that it can detect whether a manipulating body has approached but cannot detect which direction the manipulating body is positioned.

Another problem with the conventional capacitive sensor described above is that it cannot detect the proximity of a plurality of manipulating bodies with high precision.

The present invention provides a capacitive sensor that can highly precisely detect the direction in which a manipulating body is positioned.

The present invention also provides a capacitive sensor that can highly precisely detect the number of manipulating bodies.

To solve the problems with the conventional technology described above, a capacitive sensor in the present invention has a plurality of first electrodes placed on a common circumference, each first electrode generating a capacitance according to a distance to a manipulating body, a capacitance detecting means that detects capacitances generated in the plurality of first electrodes, and a deciding means that decides the direction in which the manipulating body is positioned according to a capacitance detected for each of the plurality of first electrodes under the condition that the sum of the capacitances detected for the plurality of first electrodes is equal to or larger than a first threshold.

According to this configuration, since a plurality of first electrodes are placed on a common circumference, when, for example, a manipulating body approaches, it is possible to have the capacitance of the relevant first electrode meet a prescribed condition. Therefore, the direction in which the manipulating body is positioned can be identified.

Also, according to this configuration, if the condition is not met that the sum of the capacitances detected for the plurality of first electrodes is equal to or larger than the first threshold, that is, if there is the possibility that a correct decision cannot be made due to an influence such as ambient noise, a decision is not made. Therefore, a highly reliable decision can be made.

Preferably, the deciding means identifies, from the plurality of first electrodes, the first electrode for which the maximum capacitance has been detected. If the capacitance of the identified first electrode is equal to or larger than a second threshold, the deciding means decides that the manipulating body is positioned in the direction of the identified first electrode.

According to this configuration, if the maximum capacitance is equal to or larger than the second threshold, the deciding means decides that the manipulating body is positioned in the direction of the first electrode having maximum capacitance, a decision can be made under the condition that the state is such that capacitances have been correctly detected, so a highly reliable decision can be made.

Preferably, if the capacitance of the identified first electrode is smaller than the second threshold, the deciding means decides that the manipulating body is positioned in a direction perpendicular to a plane on which the plurality of first electrodes are placed.

According to this configuration, highly precise detection is possible in a case as well in which the manipulating body is positioned in the perpendicular direction.

Preferably, a second electrode is positioned at the center of the circumference enclosed by the plurality of first electrodes, a third electrode in a ring shape is provided so as to enclose the plurality of first electrodes, and the deciding means decides the number of manipulating bodies that have approached according to individual capacitances detected for the plurality of first electrodes under the condition that the sum of capacitances detected for the plurality of first electrodes, the second electrode, and the third electrode is equal to or larger than the first threshold.

According to this configuration, since the total area of electrodes can be increased by providing the second electrode at the center of the circumference enclosed by the plurality of first electrodes and also providing the third electrode in a ring shape so as to enclose the plurality of first electrodes, it is possible to highly precisely detect that the manipulating body has approached and to decide the number of manipulating bodies in a state in which reliability is higher.

Preferably, the deciding means decides the number of manipulating bodies that have approached according to the capacitance detected for each of the plurality of first electrodes under the condition that the sum of capacitances detected for the plurality of first electrodes is equal to or larger than a third threshold, which is larger than the first threshold.

According to this configuration, since a plurality of first electrodes are placed on a common circumference, when, for example, a plurality of manipulating bodies have approached, it is possible to have the capacitance of the first electrode meet a prescribed condition corresponding to the number of manipulating bodies. Therefore, the number of manipulating bodies can be identified.

Also, according to this configuration, if the condition is not met that the sum of the capacitances detected for the plurality of first electrodes is equal to or larger than the third threshold, that is, if there is the possibility that a correct decision cannot be made due to an influence such as ambient noise, a decision is not made. Therefore, a highly reliable decision can be made.

Preferably, the deciding means decides the number of manipulating bodies that have approached according to the capacitance detected for each of the plurality of first electrodes under the condition that the sum of capacitances detected for the plurality of first electrodes, the second electrode, and the third electrode is equal to or larger than the third threshold.

According to this configuration, since the total area of electrodes can be increased by providing the second electrode at the center of the circumference enclosed by the plurality of first electrodes and also providing the third electrode in a ring shape so as to enclose the plurality of first electrodes, it is possible to highly precisely detect the number of manipulating bodies and to decide the number of manipulating bodies in a state in which reliability is higher.

Preferably, if the deciding means decides that the manipulating body is positioned only on the tops of first electrodes according to the capacitances detected for the second electrode and third electrode, the deciding means performs processing to identify the number of manipulating bodies and their positions.

According to this configuration, if the manipulating body is also positioned on the top of the second electrode or third electrode besides first electrodes, detection of the identification of the number of manipulating bodies and their positions can be selected instead of detection of the direction of the manipulating body.

Preferably, the deciding means identifies, from the plurality of first electrodes, the number of first electrodes the capacitances of which are equal to or larger than a fourth threshold, and calculates the barycentric coordinate of the identified first electrodes.

According to this configuration, it is possible to highly precisely calculate the barycentric coordinate of a plurality of manipulating bodies that have approached a plurality of first electrodes.

Preferably, if the deciding means decides that the manipulating body is also positioned on the top of the second electrode or third electrode besides first electrodes according to the capacitances detected for the second electrode and third electrode, the deciding means decides that the number of manipulating bodies is 1.

According to this configuration, when the manipulating body is positioned on the top of the second electrode or third electrode besides the first electrodes, a single or a plurality of manipulating bodies can be regarded as a single manipulating body.

Preferably, if the deciding means decides that the manipulating body is also positioned on the top of the second electrode or third electrode besides first electrodes, the deciding means identifies, from the first electrodes, second electrode, and third electrode, electrodes the capacitances of which are equal to or larger than a fifth threshold, and calculates a barycentric coordinate according to the positions of the identified electrodes.

According to this configuration, a barycentric coordinate according to the posture of one manipulating body can be calculated.

Preferably, if the sum is smaller than the third threshold, the deciding means decides the direction in which the manipulating body is positioned according to the capacitance detected for each of the plurality of first electrodes.

According to this configuration, if a manipulating body is too distant to precisely detect the number of manipulating bodies but is positioned within a distance that is short enough to detect the direction of the manipulating body, the direction of the manipulating body is decided. Therefore, it is possible to highly precisely detect the direction of the manipulating body and to reduce the possibility that the number of manipulating bodies is incorrectly decided.

Preferably, the plurality of first electrodes have the same shape and are placed in a circumferential direction at equal intervals.

Preferably, the deciding means decides the motion of the manipulating body according to time-dependent changes in the capacitance detected for each of the plurality of first electrodes.

According to this configuration, it is possible to decide the motion of the manipulating body that, for example, has approached.

According to the present invention, it is possible to provide a capacitive sensor that can highly precisely detect the direction in which a manipulating body is positioned.

The present invention can also provide a capacitive sensor that can highly precisely detect the number of manipulating bodies.

According to the present invention, it is possible to provide a capacitive sensor that can highly precisely detect the direction in which a manipulating body is positioned.

The present invention can also provide a capacitive sensor that can highly precisely detect the number of manipulating bodies.

Figure 1:
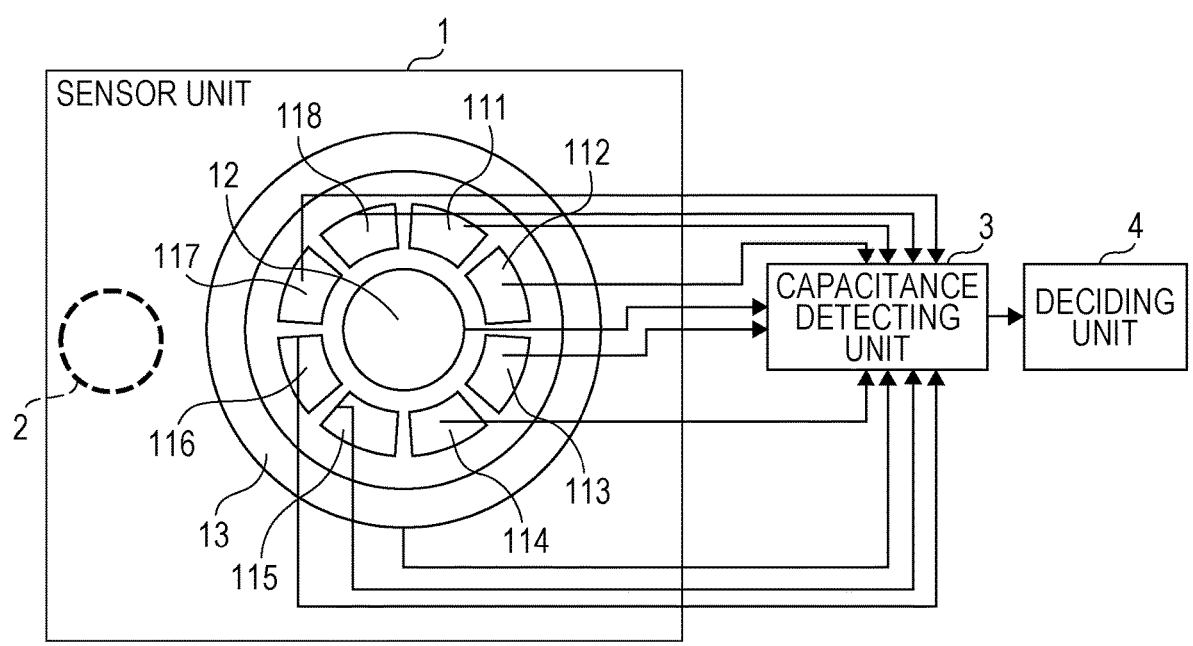
FIG. 1 is a plan view illustrating the structure of a capacitive sensor according to an embodiment of the present invention.
Figure 2:
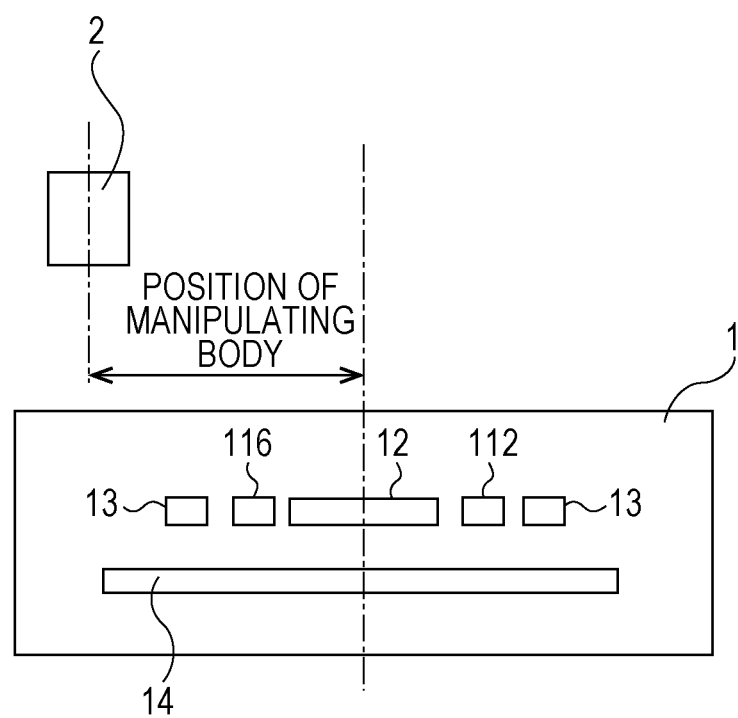
FIG. 2 is a cross-sectional view illustrating the configuration of the capacitive sensor illustrated in FIG. 1.
Figure 10:
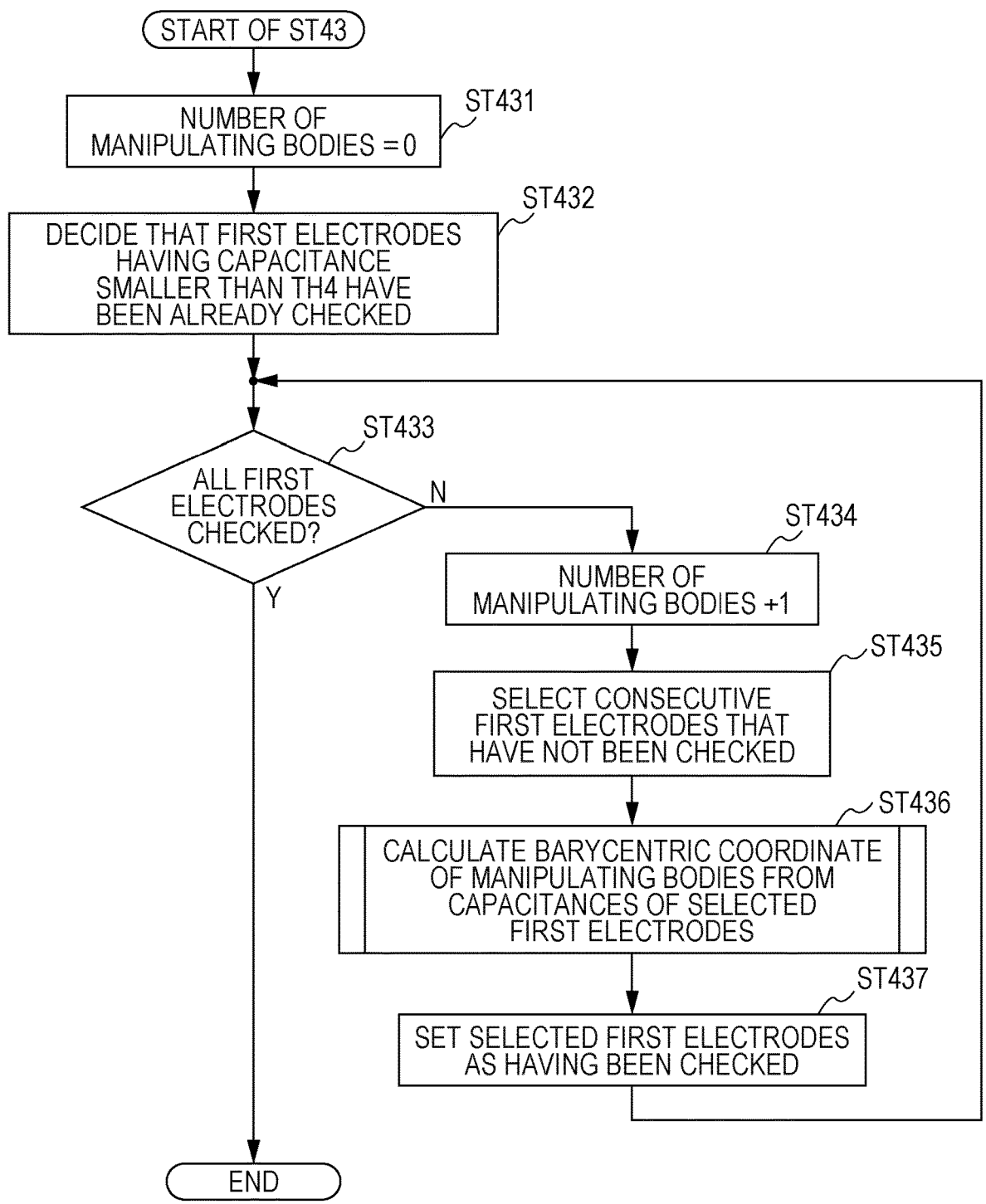
FIG. 10 is a flowchart used to explain a method of identifying the number of manipulating bodies on first electrodes and the coordinates of the manipulating bodies in step ST43 illustrated in FIG. 8.
Figures 14A, 14B:
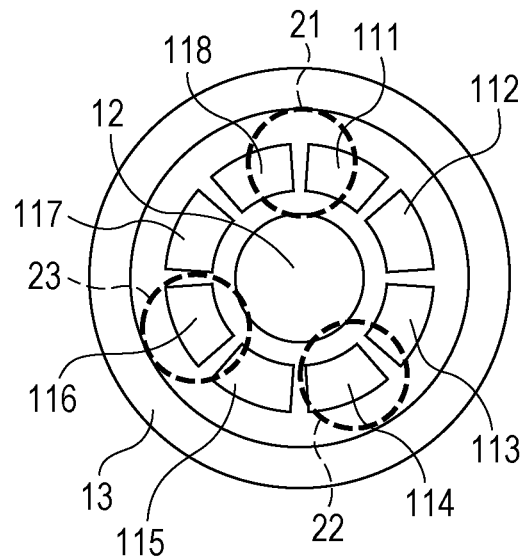
Figures 16A, 16B:
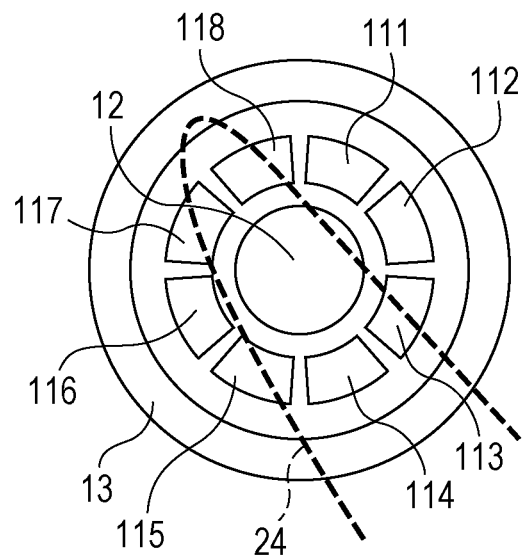
Figure 17:
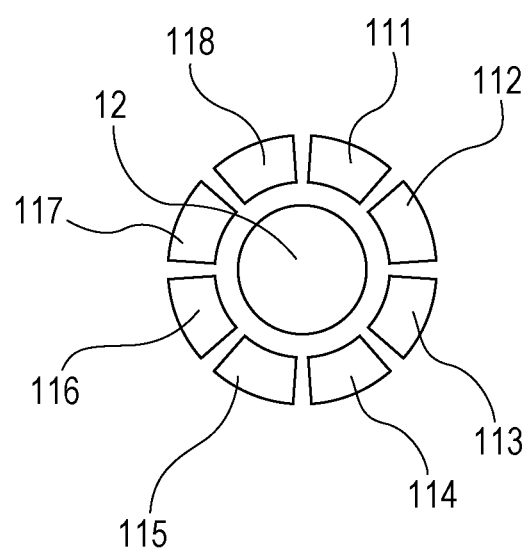
Figure 18:
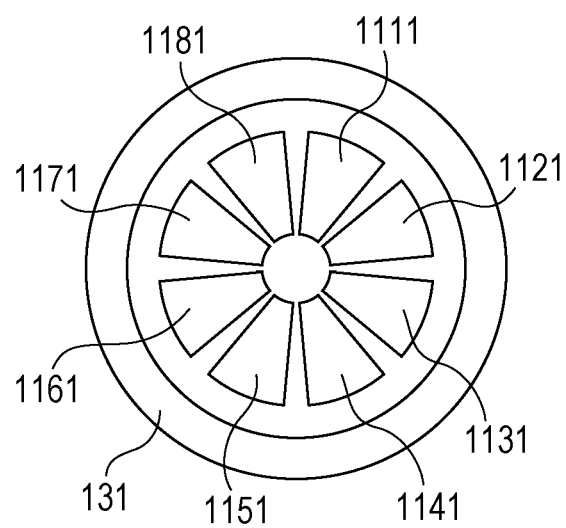
Figure 19:
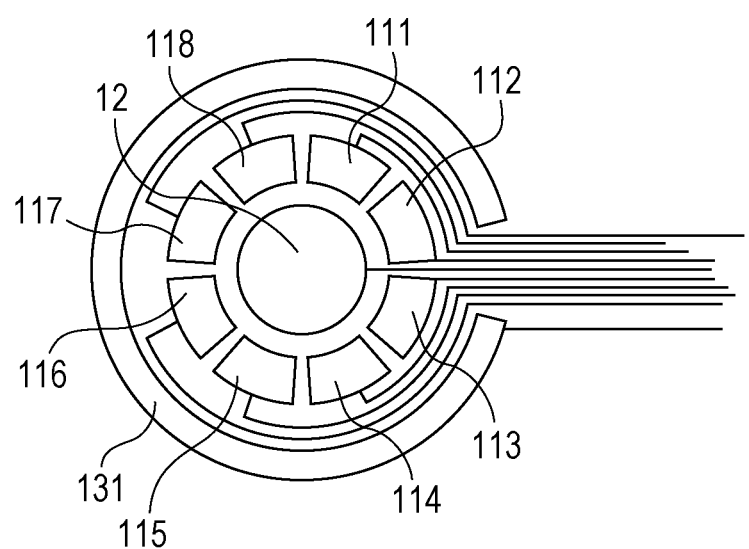

13B is an example, in this case, of the capacitances of the first electrodes, second electrode, and third electrode as well as the sum of these capacitances;

FIG. 14A conceptually illustrates that three manipulation bodies have come into contact with the capacitive sensor illustrated in FIGS. 1 and 2 so that they are positioned apart from the tops of first electrodes, and FIG. 14B is an example, in this case, of the capacitances of the first electrodes, second electrode, and third electrode as well as the sum of these capacitances;

FIGS. 15A to 15D illustrate a flow in which, in step ST436 in FIG. 10, the number of manipulating bodies and their coordinates are calculated from the capacitances indicated in FIG. 14B;

FIG. 16A conceptually illustrates that one manipulating body is positioned apart from the tops of first electrodes when the manipulating body has widely come into contact with the capacitive sensor illustrated in FIGS. 1 and 2, and FIG. 16B is an example, in this case, of the capacitances of the first electrodes, second electrode, and third electrode as well as the sum of these capacitances;

FIG. 17 is a plan view illustrating the structure of a capacitive sensor composed of only the first electrodes and second electrode, according to an embodiment of the present invention;

FIG. 18 is a plan view illustrating the structure of a capacitive sensor composed of only the first electrodes and third electrode, according to an embodiment of the present invention; and FIG. 19 is a plan view illustrating the structure of a capacitive sensor in which the third electrode is not in a complete ring shape, according to an embodiment of the present invention.

DESCRIPTION OF THE PREFERRED EMBODIMENTS

A capacitive sensor according to embodiments of the present invention will be described below.

FIG. 1 is a plan view illustrating the structure of a capacitive sensor according to an embodiment of the present invention. FIG. 2 is a cross-sectional view illustrating the configuration of the capacitive sensor illustrated in FIG. 1.

Figure 3:
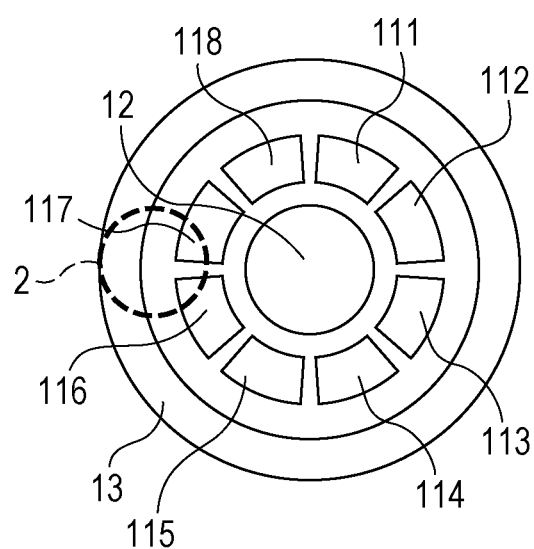
FIG. 3 is a drawing illustrating a case in which one manipulating body is present in FIG. 1.
Figure 4:
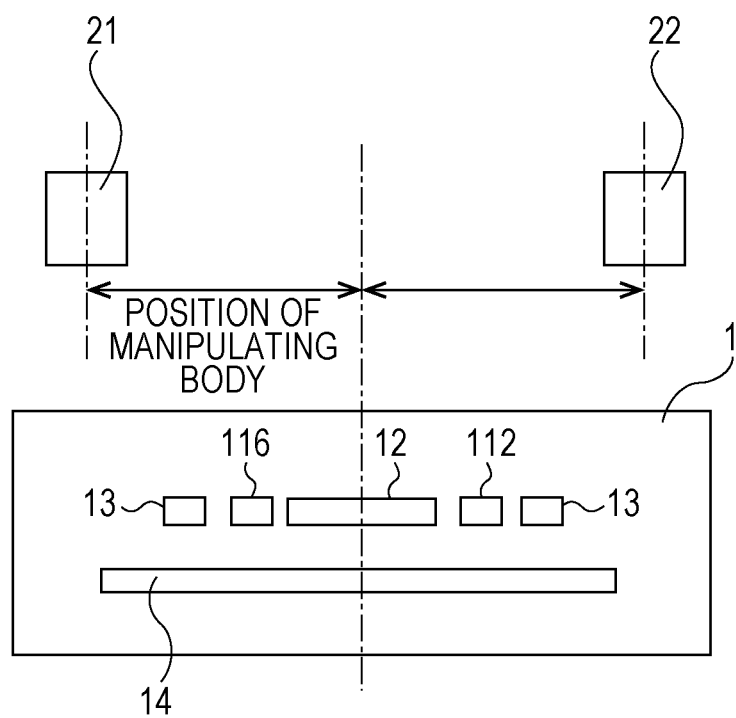
FIG. 4 is a cross-sectional view illustrating the capacitive sensor in a case in which two manipulating bodies are present.
Figure 5:
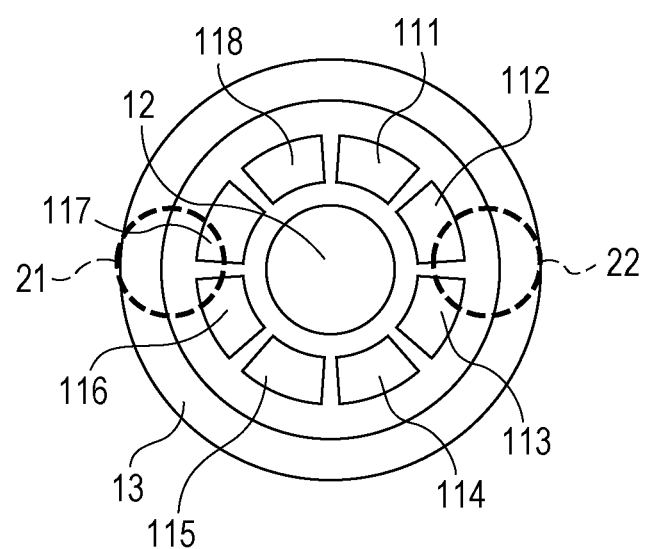
FIG. 5 is a plan view illustrating the structure in the case of FIG. 4.
Figure 6:
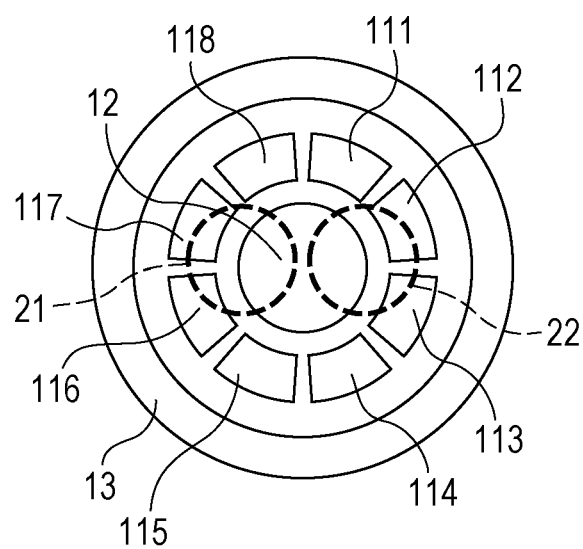
FIG. 6 illustrates the motion of the two manipulating bodies.

FIG. 3 is a drawing illustrating a case in which one manipulating body 2 is present in FIG. 1. FIG. 4 is a cross-sectional view illustrating the capacitive sensor in a case in which two manipulating bodies, 21 and 22, are present. FIG. 5 is a plan view illustrating the structure in the case of FIG. 4. FIG. 6 illustrates the motion of the two manipulating bodies, 21 and 22.

As illustrated in FIG. 1, a sensor unit 1 in the capacitive sensor has first electrodes 111, 112, 113, 114, 115, 116, 117, and 118, a second electrode 12, and a third electrode 13, which are disposed at places where the manipulating body 2, which is part of a human body such as a finger, is detected. These electrodes are provided on, for example, a common plane.

The capacitive sensor also has a capacitance detecting unit 3 and a deciding unit 4.

As illustrated in FIG. 1, the second electrode 12 has a discoid shape. The first electrodes 111 to 118, each of which is of a fan type and preferably has the same shape and the same size, are provided at equal angular intervals around the second electrode 12 so as to enclose the second electrode 12.

The third electrode 13, which is formed in a ring shape so as to enclose the second electrode 12, is preferably provided outside the first electrodes 111 to 118.

As illustrated in FIG. 2, a shield electrode 14 is formed on a substrate on a rear surface opposite to on a surface (not illustrated) on which the first electrodes 111 to 118, second electrode 12, and third electrode 13 are manipulated.

In the capacitive sensor, when the grounded manipulating body 2 approaches one of the first electrodes 111 to 118, second electrode 12, and third electrode 13, a capacitor under measurement is formed between the relevant electrode and the manipulating body 2. The capacitive sensor detects the proximity of the manipulating body 2 by detecting the capacitance of the capacitor under measurement. Between the manipulating body 2 and one of the first electrodes 111 to 118, second electrode 12, and the third electrode 13, a capacitance is generated according to the distance between them.

The capacitance detecting unit 3 detects a capacitance between the ground (manipulating body 2) and each of the first electrodes 111 to 118, second electrode 12, and third electrode 13 in a self-capacitance method.

The capacitance detecting unit 3 applies a pulse voltage, which is a predetermined voltage, to an electrode to be detected, which is one of the first electrodes 111 to 118, second electrode 12, third electrode 13, so that charge is accumulated in the capacitor under measurement, which is formed between the manipulating body 2 and the electrode to be detected. Then, the capacitance detecting unit 3 supplies the accumulated charge to a capacitor for measurement and detects the capacitance of the capacitor under measurement, that is, the electrode to be detected by measuring the voltage of the capacitor for measurement.

The capacitance detecting unit 3 outputs capacitances detected for the first electrodes 111 to 118, second electrode 12, and third electrode 13 to the deciding unit 4.

In this embodiment, the capacitances of the first electrodes 111, 112, 113, 114, 115, 116, 117 and 118, the second electrode 12, and the third electrode 13 will be respectively denoted CA111, CA112, CA113, CA114, CA115, CA116, CA117, CA118, CA12, and CA13.

The deciding unit 4 decides the number of manipulating bodies 2 or the like and directions in which the manipulating bodies 2 or the like are positioned, according to the capacitances received from the capacitance detecting unit 3.

The deciding unit 4 calculates the sum SUM of the capacitances CA111 to CA118, CA12, and CA13.

Under the condition that the sum SUM is equal to or greater than a third threshold TH3 (greater than a first TH1 described later), the deciding unit 4 preferably performs decision processing for the number of manipulating bodies 2 close to (or in contact with) the capacitive sensor and their coordinates.

In decision processing as to whether or not the manipulating body 2 described above is present only on first electrodes, if the deciding unit 4 preferably decides that the manipulating body 2 is present only on the first electrodes, the deciding unit 4 performs count and coordinate identification processing for the number of manipulating bodies 2 present on the first electrodes and the coordinates of the manipulating bodies.

In the count and coordinate identification processing, the deciding unit 4 identifies a group of consecutive first electrodes for which a capacitance exceeding a sixth threshold TH6 has been detected, the capacitance being any one of the capacitances CA111 to CA118, for example, after which the deciding unit 4 calculates the number of manipulating bodies 2 from the count of the identified first electrode group and also calculates the coordinates of the manipulating bodies from the barycenter of the capacitances of the identified first electrode group.

In the decision processing as to whether or not the manipulating body 2 described above is present only on first electrodes, if the deciding unit 4 decides that the manipulating body 2 is also present on other than the first electrodes, the deciding unit 4 preferably regards a single or a plurality of manipulating bodies 2 as a single manipulating body and identifies the barycenter of the manipulating body 2 or the like.

For example, the deciding unit 4 identifies a barycentric point from the capacitances CA111 to CA118, CA12, and CA13 as well as the positions of the first electrodes 111 to 118, second electrode 12, and third electrode 13. Specifically, the deciding unit 4 obtains the barycenter by giving each position a capacitance corresponding to it as weighting.

If the capacitance CA12 of the second electrode 12 is equal to or larger than the sixth threshold TH6, the deciding unit 4 decides that the manipulating body 2 is also present on other than the first electrodes.

If the capacitance CA13 of the third electrode 13 is equal to or larger than a seventh threshold TH7, the deciding unit 4 decides that the manipulating body 2 is also present on other than the first electrodes.

If the capacitance CA12 of the second electrode 12 is smaller than the sixth threshold TH6 and the capacitance CA13 of the third electrode 13 is smaller than the seventh threshold TH7, the deciding unit 4 decides that the manipulating body 2 is present only on first electrodes.

Figure 7:
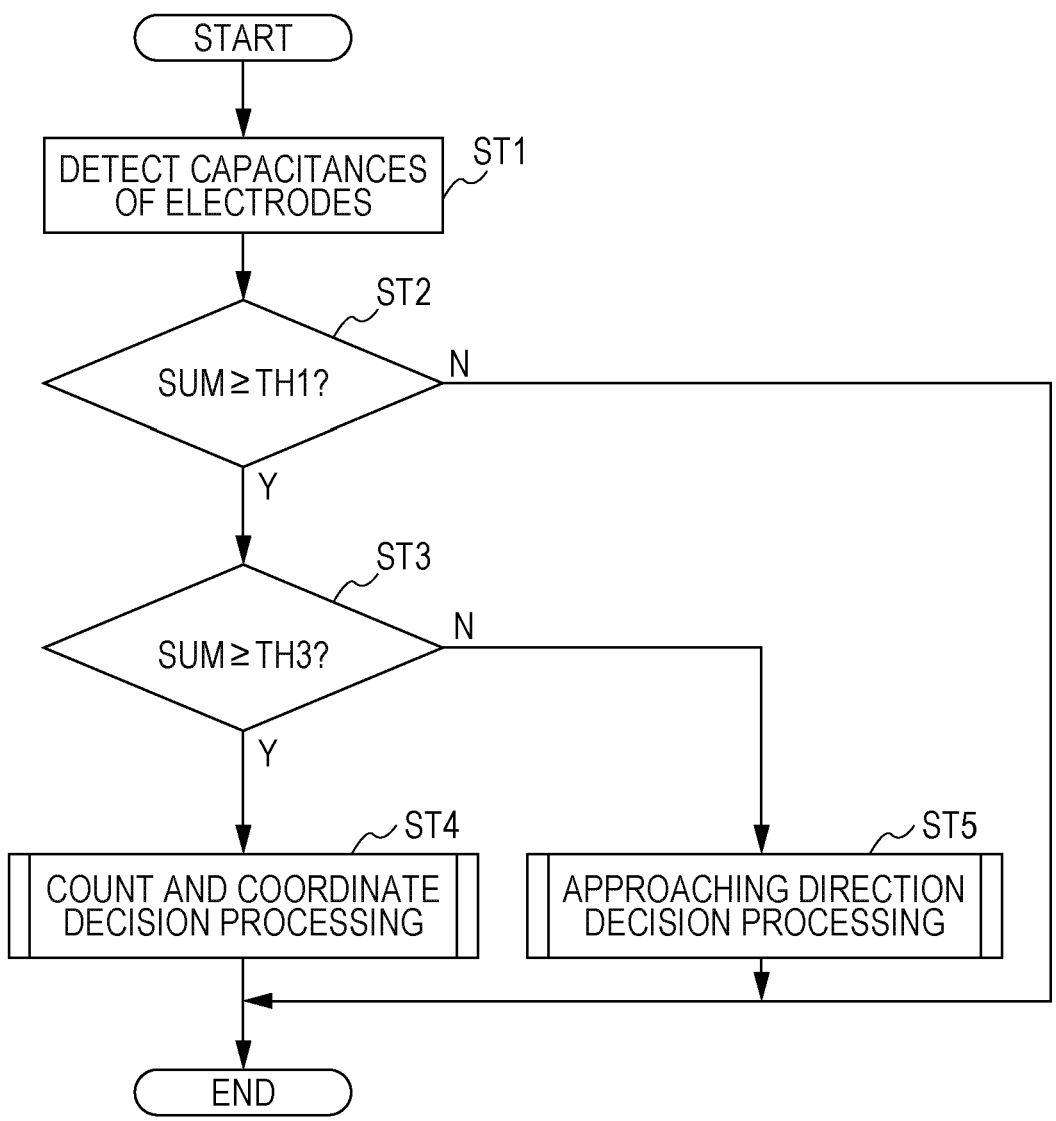
FIG. 7 is a flowchart used to explain an example of the whole operation of the capacitive sensor illustrated in FIGS. 1 and 2.

Under the condition that the sum SUM is equal to or larger than a first threshold TH1 (smaller than TH3), the deciding unit 4 preferably decides the direction in which the manipulating body 2 is positioned according to the capacitances CA111 to CA118, as illustrated in FIG. 7.

The deciding unit 4 preferably identifies the first electrode 111, 112, 113, 114, 115, 116, 117, or 118 that has the maximum capacitance among the capacitances CA111 to CA118.

Figure 12:
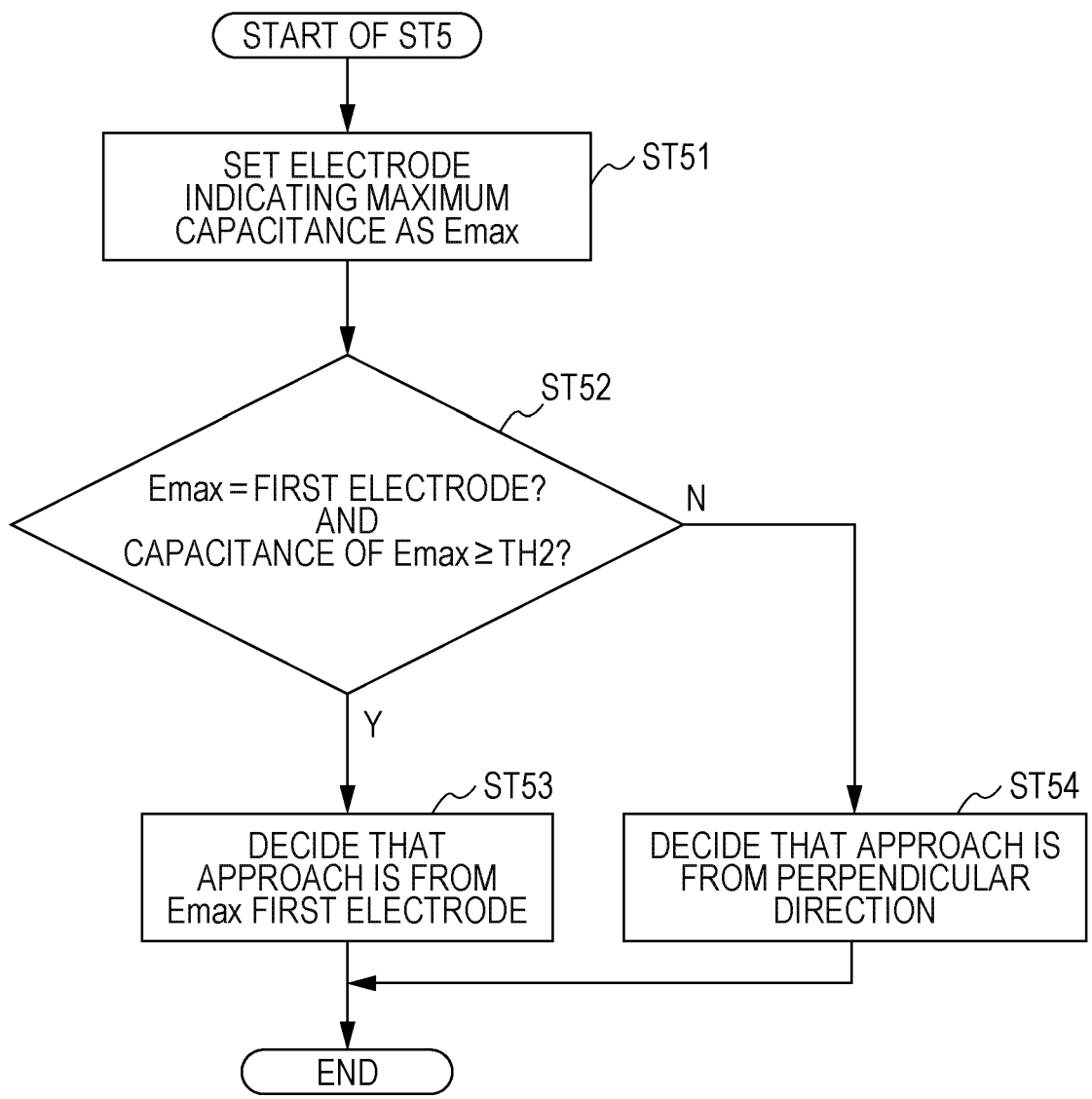
FIG. 12 is a drawing used to explain a method of deciding the direction in which the manipulating body approaches, the direction being calculated in step ST5 in FIG. 7.

Then, if the capacitance of the identified first electrode is equal to or larger than a second threshold TH2, the deciding unit 4 preferably decides that the manipulating body 2 is positioned in the direction of the identified first electrode, as illustrated in FIG. 12.

The deciding unit 4 preferably decides the motion of the manipulating body 2 according to time-dependent changes in the capacitances CA111 to CA118. When, for example, two manipulating bodies 21 and 22 are detected, the deciding unit 4 decides motion from their positions illustrated in FIG. 5 to their positions illustrated in FIG. 6.

An example of the operation of the capacitive sensor illustrated in FIGS. 1 and 2 will be described below.

FIG. 7 is a flowchart used to explain an example of the whole operation of the capacitive sensor illustrated in FIGS. 1 and 2.

The capacitive sensor performs processing illustrated in FIG. 7 at a constant period.

Step ST1:
The capacitance detecting unit 3 detects the capacitances CA111 to CA118, CA12, and CA13 for the respective first electrodes 111 to 118, second electrode 12, and third electrode 13.

The capacitance detecting unit 3 outputs the detected capacitances CA111 to CA118, CA12, and CA13 to the deciding unit 4.

Step ST2:
The deciding unit 4 calculates the sum SUM of the capacitances CA111 to CA118, CA12, and CA13 entered in step ST1.

The deciding unit 4 decides whether or not the sum SUM is equal to or larger than the first threshold TH1. If the decision is affirmative, the deciding unit 4 proceeds to step ST3. If the decision is negative, the deciding unit 4 terminates the processing. Here, the first threshold TH1 has been set to a value with which approaching direction decision processing in step ST5 can be performed with certain reliability.

Step ST3:
The deciding unit 4 decides whether or not the sum SUM is equal to or larger than the third threshold TH3. If the decision is affirmative, the deciding unit 4 proceeds to step ST4. If the decision is negative, the deciding unit 4 proceeds to step ST5.

Step ST4:
The deciding unit 4 decides the number of manipulating bodies 2 and their coordinates. Processing to decide the number of manipulating bodies 2 and their coordinates will be described in detail with reference to FIG. 8.

Step ST5:
The deciding unit 4 decides the direction of the manipulating body 2. Processing to decide the direction will be described in detail with reference to FIG. 12.

A method of deciding the number of manipulating bodies 2 or the like and their coordinates will be described below, the method being in step ST4 illustrated in FIG. 7.

Figure 8:
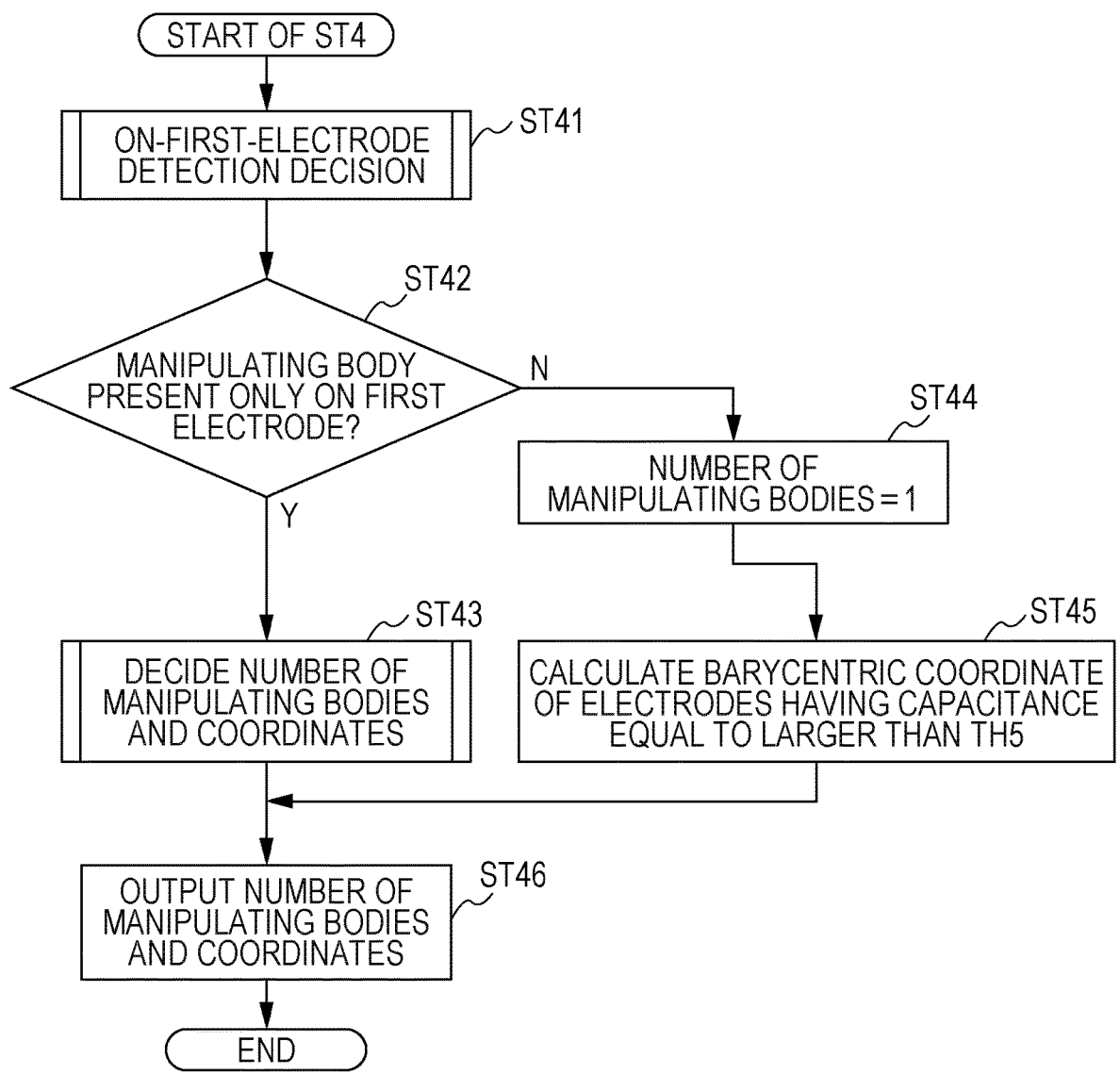
FIG. 8 is a flowchart used to explain processing performed during a contact decision in step ST4 illustrated in FIG. 7.

FIG. 8 is a flowchart used to explain the method of deciding the number and the coordinates in step ST4 illustrated in FIG. 7.

Step ST41:
The deciding unit 4 decides whether or not manipulating body 2 or the like is present only on first electrodes. The deciding processing will be described in detail with reference to FIG. 9.

Step ST42:
If the deciding unit 4 decides in step ST41 that the manipulating body 2 or the like is present only on first electrodes, the deciding unit 4 processes to step ST43. If not, the deciding unit 4 proceeds to step ST44.

Step ST43:
The deciding unit 4 decides the number of manipulating bodies 2 present on the first electrodes and the coordinates of the manipulating bodies 2. The deciding processing will be described in detail with reference to FIG. 10.

Step ST44:
The deciding unit 4 decides that the number of manipulating bodies 2 is 1.

Step ST45:
The deciding unit 4 identifies the barycenter of a single or a plurality of manipulating bodies 2 or the like.

For example, the deciding unit 4 identifies a barycentric point according to the capacitances CA111 to CA118, CA12, and CA13 as well as the positions of the first electrodes 111 to 118, second electrode 12, and third electrode 13.

Specifically, the deciding unit 4 preferably identifies electrodes the capacitances of which are equal to or larger than a fifth threshold TH5, the electrodes being included in the first electrodes 111 to 118, second electrode 12, and third electrode 13, and calculates a barycentric coordinate according to the positions of the identified electrodes.

Step ST46:

The deciding unit 4 outputs the decided number of manipulating bodies 2 and their coordinates.

A method of deciding whether or not the manipulating body 2 or the like is present only on a first electrode will be described below, the method being in step ST41 illustrated in FIG. 8.

Figure 9:
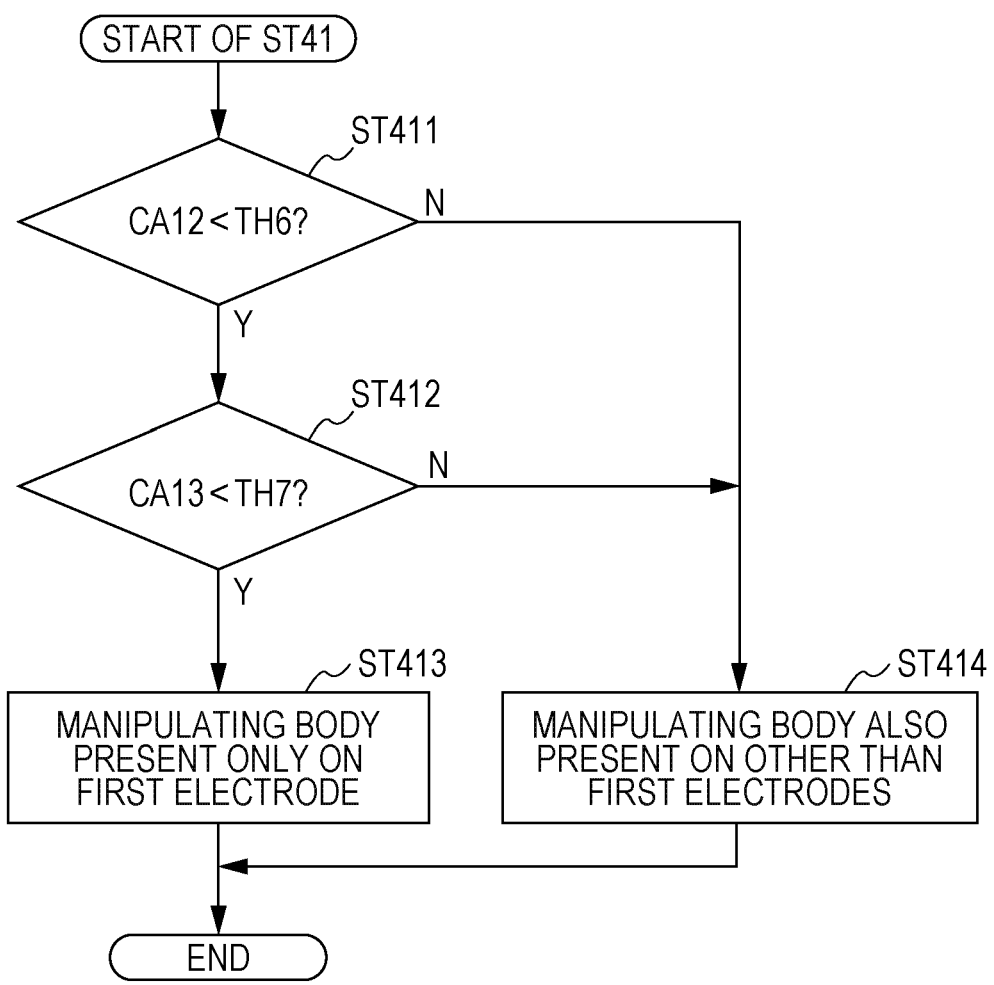
FIG. 9 is a flowchart used to explain a method of deciding whether or not the manipulating body in step ST41 illustrated in FIG. 8 is present only on first electrodes.

FIG. 9 is a flowchart used to explain the on-first-electrodes detection decision method in step ST41 illustrated in FIG. 8.

Step ST411:

The deciding unit 4 decides whether or not the capacitance CA12 of the second electrode 12 is smaller than the sixth threshold TH6. If the decision is affirmative, the deciding unit 4 proceeds to step ST412. If the decision is negative, the deciding unit 4 proceeds to step ST414.

Step ST412:

The deciding unit 4 decides whether or not the capacitance CA13 of the third electrode 13 is smaller than the seventh threshold TH7. If the decision is affirmative, the deciding unit 4 proceeds to step ST413. If the decision is negative, the deciding unit 4 proceeds to step ST414.

Step ST413:

The deciding unit 4 decides that the manipulating body 2 or the like is present only on first electrodes.

Step ST414:

The deciding unit 4 decides that the manipulating body 2 or the like is also present on other than the first electrodes.

A method of deciding the number of manipulating bodies 2 present on first electrodes and the coordinates of the manipulating bodies 2 will be described below, the method being in step ST43 illustrated in FIG. 8.

FIG. 10 is a flowchart used to explain the method of deciding the number of manipulating bodies 2 and their coordinates, the method being in step ST43 illustrated in FIG. 8.

Step ST431:

The deciding unit 4 initializes the number of manipulating bodies 2 to 0.

Step ST432:

The deciding unit 4 decides that the first electrodes 111 to 118 for which the capacitances CA111 to CA118 are smaller than a fourth threshold TH4 have been already checked.

Step ST433:

The deciding unit 4 scans the first electrodes 111 to 118, and decides whether or not all of these electrodes have been checked. If the decision is affirmative, the deciding unit 4 terminates the processing. If the decision is negative, the deciding unit 4 proceeds to step ST434.

Step ST434:

The deciding unit 4 increments the number of manipulating bodies 2 by one.

Step ST435:

The deciding unit 4 selects one or more consecutive first electrodes that have not been checked and are enclosed by checked electrodes included in the first electrodes 111 to 118.

Step ST436:

The deciding unit 4 calculates the barycentric coordinate of the manipulating bodies the number of which has been increased in step ST434 from the capacitances of the first electrodes selected in step ST435, as the barycentric coordinate of the manipulating bodies.

Step ST437:

The deciding unit 4 sets the first electrodes selected in step ST435 as having been checked.

The method, indicated in step ST5 in FIG. 7, of deciding the direction in which the manipulating body 2 approaches will be described below.

FIG. 12 is a flowchart used to explain the approaching direction decision method in step ST5 illustrated in FIG. 7.

ST51:

The deciding unit 4 indicates, in a memory, the electrode that indicates the maximum value out of the capacitances CA111 to CA118, CA12, and CA13 as Emax.

Step ST52:

The deciding unit 4 decides whether or not Emax is a first electrode and the capacitance of Emax is equal to or larger than second threshold TH2. If the decision is affirmative, the deciding unit 4 proceeds to step ST53. If the decision is negative, the deciding unit 4 proceeds to step ST54.

Step ST53:

The deciding unit 4 decides that the manipulating body 2 is present in the direction of the first electrode that is Emax.

Step ST54:

The deciding unit 4 decides that the manipulating body 2 is present in a direction perpendicular to the sensor unit 1.

As described above, according to the capacitive sensor, since a plurality of first electrodes, 111 to 118, are placed on a common circumference as illustrated in FIG. 1, when, for example, a plurality of manipulating bodies 21 and 22 approach the tops of first electrodes, it is possible to have the capacitances of the relevant first electrodes meet a prescribed condition. Therefore, the number of manipulating bodies 2 and their coordinates can be identified.

According to this configuration, if the condition is not met that the sum of the capacitances CA111 to CA118, CA12, and CA13 is equal to or larger than the first threshold TH1 as indicated in step ST2 indicated in FIG. 7, that is, if there is the possibility that a correct decision cannot be made due to an influence such as ambient noise, a decision is not made. Therefore, a highly reliable decision can be made.

According to the capacitive sensor, if the capacitance of the maximum electrode Emax is equal to or larger than the second threshold TH2 as indicated in steps ST52 and ST53 in FIG. 12, it is decided that the manipulating body is positioned in the direction of the first electrode 111, 112, 113, 114, 115, 116, 117, or 118 that is the maximum electrode Emax. Therefore, a decision can be made under the condition that the state is such that capacitances have been correctly detected, so a highly reliable decision can be made.

In the capacitive sensor, processing to identify the number of manipulating bodies 2 is performed under the condition that the sum SUM of the capacitances CA111 to CA118, CA12, and CA13 is equal to or larger than the third threshold TH3, as indicated in steps ST3 and ST4 in FIG. 7. That is, if there is the possibility that a correct decision cannot be made due to an influence such as ambient noise, a decision is not made. Therefore, a highly reliable decision can be made.

According to the capacitive sensor, a decision can be made on the number of manipulating bodies 2 and their coordinates as indicated in step ST4 in FIG. 7.

Also, according to the capacitive sensor, since the total area of electrodes can be increased by providing the third electrode 13 in a ring shape so as to enclose the first electrodes 111 to 118, the proximity of the manipulating bodies 2 can be highly precisely detected and the number of manipulating bodies 2 can be decided with high reliability.

Also, according to the capacitive sensor, whether or not the manipulating body is about to come into contact with only first electrodes can be highly precisely decided by deciding whether or not the manipulating body 2 is present only on first electrodes as indicated in step ST41 in FIG. 8.

Also, according to the capacitive sensor, when the number of manipulating bodies 2 present on first electrodes and the coordinates of the manipulating bodies 2 are decided as indicated in step ST43 in FIG. 8, a complex decision can be achieved from the number of manipulating bodies 2 present on first electrodes and the coordinates of the manipulating bodies 2.

Specific examples of the operation of the capacitive sensor described above will be described below.

Figures 13A, 13B:
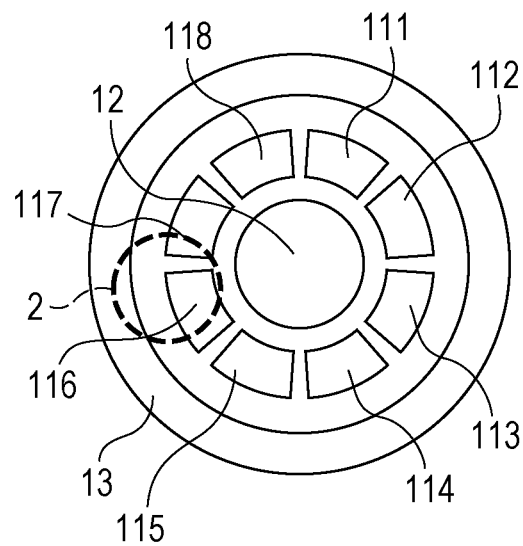
FIG. 13A conceptually illustrates that one manipulating body is positioned apart from on the top of a first electrode in the capacitive sensor illustrated in FIGS. 1 and 2, and FIG.

In a case in which the manipulating body 2 is positioned apart from the top of the first electrode 116 as illustrated in FIG. 13A and the capacitances CA111 to CA118, CA12, and CA13 are obtained as indicated in FIG. 13B, how the flowchart illustrated in FIG. 7 is processed will be described.

FIG. 13A conceptually illustrates that the manipulating body 2 is positioned apart from the top of the first electrode 116. FIG. 13B is an example, in this case, of the capacitances CA111 to CA118, CA12, and CA13 as well as the sum SUM of these capacitances.

In step ST1 in the flowchart in FIG. 7, the capacitances CA111 to CA118, CA12, and CA13 are obtained from the capacitance detecting unit 3 as indicated in FIG. 13B. Then, the sequence proceeds to step ST2.

In step ST2 in the flowchart in FIG. 7, the sum SUM (which is 52) of the capacitances CA111 to CA118, CA12, and CA13 indicated in FIG. 13B is calculated and is compared with TH1.

If TH1 is 50, the decision in step ST2 is affirmative and the sequence proceeds to step ST3.

In step ST3 in the flowchart in FIG. 7, the capacitance SUM (which is 52) illustrated in FIG. 13B is compared with TH3.

If TH3 is 200, the decision in step ST3 is negative and the sequence proceeds to steps ST5 and ST51 in FIG. 12.

In step ST51 in the flowchart in FIG. 12, the electrode Emax indicating the maximum value is retrieved from among the capacitances CA111 to CA118, CA12, and CA13 illustrated in FIG. 13B.

Since CA116 is maximum (which is 10), the electrode 116 is assumed to be the Emax and the sequence proceeds to step ST52.

In step ST52 in the flowchart in FIG. 12, it is decided whether or not Emax is a first electrode and has a capacitance equal to or larger than the second threshold TH2.

If TH2 is 5, as the electrode 116 is a first electrode and CA116 is larger than TH2, the sequence proceeds to step ST53.

In step ST53 in the flowchart in FIG. 12, it is decided that the manipulating body 2 is in the direction of Emax.

Since Emax is the electrode 116, it is decided that the manipulating body 2 is present in the direction of the electrode 116. Then, the whole of the flow is terminated.

In a case in which manipulating bodies 21, 22, and 23 come into contact with the tops of first electrodes as illustrated in FIG. 14A and the capacitances CA111 to CA118, CA12, and CA13 are obtained as indicated in FIG. 14B, how the flowchart illustrated in FIG. 7 is processed will be described below.

FIG. 14A conceptually illustrates that the manipulating bodies 21, 22, and 23 are positioned on the tops of first electrodes. FIG. 14B is an example, in this case, of the capacitances CA111 to CA118, CA12, and CA13 as well as the sum SUM of these capacitances.

In step ST1 in the flowchart in FIG. 7, the capacitances CA111 to CA118, CA12, and CA13 are obtained from the capacitance detecting unit 3 as indicated in FIG. 14B. Then, the sequence proceeds to step ST2.

In step ST2 in the flowchart in FIG. 7, the sum SUM (which is 400) of the capacitances CA111 to CA118, CA12, and CA13 indicated in FIG. 14B is calculated and is compared with TH1.

If TH1 is 50, the decision in step ST2 is affirmative and the sequence proceeds to step ST3.

In step ST3 in the flowchart in FIG. 7, the capacitance SUM (which is 400) illustrated in FIG. 14B is compared with TH3.

If TH3 is 200, the decision in step ST2 is affirmative and the sequence proceeds to step ST4, step ST41 in FIG. 8, and step ST411 in FIG. 9.

In step ST411 in the flowchart in FIG. 9, the capacitance CA12 (which is 20) illustrated in FIG. 14B is compared with TH6.

If TH6 is 50, the decision in step ST411 is affirmative and the sequence proceeds to step ST412.

In step ST412 in the flowchart in FIG. 9, the capacitance CA13 (which is 30) illustrated in FIG. 14B is compared with TH7.

If TH7 is 50, the decision in step ST412 is affirmative and the sequence proceeds to step ST413.

In step ST413 in the flowchart in FIG. 9, it is decided that the manipulating body 2 is present only on a first electrode and the sequence proceeds to step ST42 in FIG. 8.

In step ST42 in the flowchart in FIG. 8, it is decided whether or not the manipulating body 2 is present only on first electrodes.

Since it has been decided in step ST413 that the manipulating body 2 is present only on first electrodes, the decision in step ST42 is affirmative and the sequence proceeds to step ST43 and step ST431 in FIG. 10.

In step ST431 in the flowchart in FIG. 10, the number of manipulating bodies 2 is initialized to 0. Then, the sequence proceeds to step ST432.

In step ST432 in the flowchart in FIG. 10, first electrodes having a capacitance smaller than the fourth threshold TH4 are set as having been checked.

If TH4 is 50, the first electrodes 112, 113, 115, and 117 are set as having been checked and the sequence proceeds to step ST433.

FIG. 15A is a data state in the deciding unit 4 at that time.

In step ST433 in the flowchart in FIG. 10, the check state of the first electrodes is confirmed. Since all first electrodes have not been checked as illustrated in FIG. 15A, the decision in step ST433 is negative and the sequence proceeds to step ST434.

In step ST434 in the flowchart in FIG. 10, the number of manipulating bodies 2 is incremented by one, changing from 0 to 1. Then, the sequence proceeds to step ST435.

In step ST435 in the flowchart in FIG. 10, consecutive electrodes that have not been checked are selected from among the first electrodes. In the case in this time, as the first electrode 111 and the first electrode 118 adjacent to it have not been checked, the first electrodes 111 and 118 are selected. Although the first electrode 114 and first electrode 116 also have not been checked, as they are not consecutive to the first electrode 111 or 118, they are not selected. Then, the sequence proceeds to step ST436.

Figure 11:
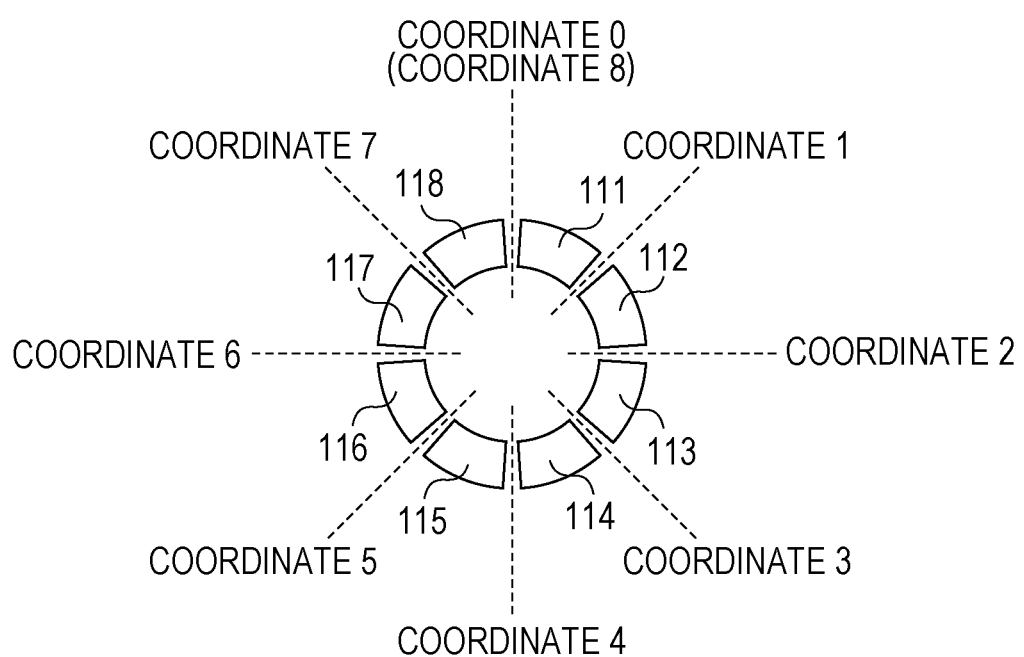
FIG. 11 is a drawing used to explain the coordinate of the manipulating body, the coordinate being calculated in step ST436 in FIG. 10.

In step ST436 in the flowchart in FIG. 10, the barycentric coordinate of the manipulating body 21 is calculated from the capacitances of the selected first electrodes 111 and 118. As shown in FIG. 11, the barycentric coordinate described here is a coordinate equivalent to an angular coordinate from the center taken when the coordinate between the first electrodes 111 and 118 is 0, the coordinate of the first electrode 111 is 0.5, the coordinate between the first electrodes 111 and 112 is 1, and so on. The barycenter of the capacitances CA111 and CA118 of the selected first electrodes 111 and 118 are just the center of the first electrodes 111 and 118. Therefore, the coordinate is calculated to be 0. Then, the sequence proceeds to step ST437.

In step ST437 in the flowchart in FIG. 10, the selected first electrodes 111 and 118 are set as having been checked and the sequence returns to step ST433.

FIG. 15B is a data state in the deciding unit 4 at that time.

In steps ST433 to ST437 in the flowchart in FIG. 10, the unchecked first electrode 114 is selected, the number of manipulating bodies is incremented by one, the coordinate of the first electrode 114 is calculated to be 3.5, the first electrode 114 is set as having been checked, and the sequence returns to step ST433.

FIG. 15C is a data state in the deciding unit 4 at that time.

In steps ST433 to 437 in the flowchart in FIG. 10, the unchecked first electrode 116 is selected, the number of manipulating bodies is incremented by one, the coordinate of the first electrode 116 is calculated to be 5.5, the first electrode 116 is set as having been checked, and the sequence returns to step ST433.

FIG. 15D is a data state in the deciding unit 4 at that time.

In step ST433 in the flowchart in FIG. 10, the check state of the first electrodes is confirmed. Since all first electrodes have been checked as indicated in FIG. 15D, the decision in step ST433 is affirmative, step ST43 is terminated, and the sequence proceeds to step ST46 in FIG. 8.

In step ST46 in the flowchart in FIG. 8, the calculated number (which is 3) of manipulating bodies, 21, 22 and 23, and coordinates (which are 0, 3.5, and 5.5) are output. Step ST4 in the flowchart in FIG. 7 and the entire flow are terminated.

In a case in which a manipulating body 24 comes into contact with the tops of first electrodes, the top of the second electrode, and the top of the third electrode so as to span these tops as illustrated in FIG. 16A and the capacitances CA111 to CA118, CA12, and CA13 are obtained as indicated in FIG. 16B, how the flowchart illustrated in FIG. 7 is processed will be described below.

FIG. 16A conceptually illustrates that the manipulating body 24 is in contact with the tops of first electrodes, the top of the second electrode, and the top of the third electrode. FIG. 16B is an example, in this case, of the capacitances of the capacitances CA111 to CA118, CA12, and CA13 as well as the sum SUM of these capacitances.

In step ST1 in the flowchart in FIG. 7, the capacitances CA111 to CA118, CA12, and CA13 are obtained from the capacitance detecting unit 3 as indicated in FIG. 16B. Then, the sequence proceeds to step ST2.

In step ST2 in the flowchart in FIG. 7, the sum SUM (which is 850) of the capacitances CA111 to CA118, CA12, and CA13 indicated in FIG. 16B is calculated and is compared with TH1.

If TH1 is 50, the decision in step ST2 is affirmative and the sequence proceeds to step ST3.

In step ST3 in the flowchart in FIG. 7, the capacitance SUM (which is 850) indicated in FIG. 16B is compared with TH3.

If TH3 is 200, the decision in step ST2 is affirmative and the sequence proceeds to step ST4, step ST41 in FIG. 8, and step ST411 in FIG. 9.

In step ST411 in the flowchart in FIG. 9, the capacitance CA12 (which is 300) indicated in FIG. 16B is compared with TH6.

If TH6 is 50, the decision in step ST411 is negative and the sequence proceeds to step ST414.

In step ST414 in the flowchart in FIG. 9, it is decided that the first electrode 24 is also present on the tops of other than the first electrodes. Then, step ST41 is terminated and the sequence proceeds to step ST42 in FIG. 8.

In step ST42 in the flowchart in FIG. 8, it is decided whether or not the manipulating body 24 is present only on first electrodes.

Since it has been decided in step ST414 that the manipulating body 24 is also present on other than the first electrodes, the decision in step ST42 is negative and the sequence proceeds to step ST44.

In step ST44 in the flowchart in FIG. 8, it is decided that the number of manipulating bodies 24 is 1. Then, the sequence proceeds to step ST45.

In step ST45 in the flowchart in FIG. 8, the barycentric coordinate of the manipulating body 24 is calculated. The result, described here, of the barycentric coordinate is output in step ST46.

FIG. 17 is an example of a sensor composed of only the first electrodes and second electrode. The present invention does not need to have all of the first electrodes, second electrode, and third electrode, and can be also realized by the sensor as shown in FIG. 17. That is, the sensor illustrated in FIG. 17 has only the first electrodes 111 to 118 and second electrode 12, and lacks the third electrode 13 illustrated in FIG. 1.

FIG. 18 is an example of a sensor composed of only the first electrodes and third electrode. The present invention does not need to have all of the first electrodes, second electrode, and third electrode, and can be also realized by the sensor as shown in FIG. 18. That is, the sensor illustrated in FIG. 18 has only first electrodes 1111, 1121, 1131, 1141, 1151, 1161, 1171, and 1181 and a third electrode 131, and lacks the second electrode 12 illustrated in FIG. 1.

FIG. 19 is an example of a sensor in which the third electrode is not in a complete ring shape. Each electrode in the present invention does not necessarily need to be completely circular or in a complete ring shape. In the example in FIG. 19, as the third electrode 131 partially has a notch, wires from the first electrodes 111 to 118 and second electrode 12 can be led out toward the outside, enabling a single-layer sensor to be formed.

The present invention is not limited to the embodiments described above.

That is, a person having ordinary skill in the art may make various modifications, combinations, sub-combinations, and replacements for the constituent elements in the embodiments described above, without departing from the technical range of the present invention or an equivalent range of the technical range.

Although, in the embodiments described above, the deciding unit 4 has compared the sum SUM of the capacitances CA111 to CA118, CA12, and CA13 with the first threshold TH1 and third threshold TH3 in steps ST2 and ST3 illustrated in FIG. 7, the sum of the capacitances CA111 to CA118 or the sum of the capacitances CA111 to CA118 and any one of the capacitances CA21 and CA31 may be used as the sum SUM.

Although, in the embodiments described above, a case has been exemplified in which both of processing, in step ST4 in FIG. 7, to identify the number of manipulating bodies and their coordinates and processing, in step ST5 in FIG. 7, to identify the direction in which the manipulating body is positioned are performed, the present invention can also be applied to a case in which only processing to identify the direction in which the manipulating body is positioned is performed.

Although, in the embodiments described above, a case has been exemplified in which the second electrode 12 and third electrode 13 are also provided, only the first electrodes 111 to 118 may be used.

The shape of the first electrodes 111 to 118 may be other than a fan shape and the number of first electrodes may be other than 8 so far as the number is plural.

The method, in the present invention, of deciding a count and a coordinate is not limited to the example illustrated in FIG. 8. The method, in the present invention, of deciding the number of manipulating bodies present on first electrodes and their coordinates is not limited to the example illustrated in FIG. 9. Furthermore, the method, in the present invention, of identifying the direction in which the manipulating body approaches is not limited to the example in FIG. 12.

The present invention can be applied to a capacitive sensor.

What is claimed is:

1. A capacitive sensor comprising:
   a plurality of first electrodes that are placed on a common circumference, each of the plurality of first electrodes generating a capacitance according to a respective distance to a manipulating body;
   a capacitance detecting means that detects capacitances generated in the plurality of first electrodes; and
   a deciding means for deciding a direction in which the manipulating body is positioned according to a capacitance detected for each of the plurality of first electrodes under a condition that a sum of the capacitances detected for the plurality of first electrodes is equal to or larger than a first threshold.

2. The capacitive sensor according to claim 1, wherein the deciding means
   identifies, from the plurality of first electrodes, a first electrode for which a maximum capacitance has been detected, and
   decides, if a capacitance of the identified first electrode is equal to or larger than a second threshold, that the manipulating body is positioned in a direction of the identified first electrode.

3. The capacitive sensor according to claim 2, wherein if the capacitance of the identified first electrode is smaller than the second threshold, the deciding means decides that the manipulating body is positioned in a direction perpendicular to a plane on which the plurality of first electrodes are placed.

4. The capacitive sensor according to claim 1, further comprising:
   a second electrode positioned at a center of the circumference enclosed by the plurality of first electrodes; and
   a third electrode in a ring shape, the third electrode being provided so as to enclose the plurality of first electrodes; wherein
   the deciding means decides the direction in which the manipulating body is positioned according to the capacitance detected for the each of the plurality of first electrodes under a condition that a sum of capacitances detected for the plurality of first electrodes, the second electrode, and the third electrode is equal to or larger than the first threshold.

5. The capacitive sensor according to claim 1, wherein the deciding means decides a number of manipulating bodies that have approached according to the capacitance detected for the each of the plurality of first electrodes under a condition that the sum of the capacitances detected for the plurality of first electrodes is equal to or larger than a third threshold, which is larger than the first threshold.

6. The capacitive sensor according to claim 5, further comprising:
   a second electrode positioned at a center of the circumference enclosed by the plurality of first electrodes; and
   a third electrode in a ring shape, the third electrode being provided so as to enclose the plurality of first electrodes; wherein
   the deciding means decides the number of manipulating bodies that have approached according to the capacitance detected for the each of the plurality of first electrodes under a condition that a sum of the capacitances detected for the plurality of first electrodes, the second electrode, and the third electrode is equal to or larger than the third threshold.

7. The capacitive sensor according to claim 6, wherein if the deciding means decides that the manipulating body is positioned only on tops of the plurality of first electrodes according to the capacitances detected for the second electrode and third electrode, the deciding means performs processing to identify the number of manipulating bodies and positions of the manipulating bodies.

8. The capacitive sensor according to claim 7, wherein the deciding means identifies, from the first electrodes, a number of first electrodes capacitances of which are equal to or larger than a fourth threshold, and calculates a barycentric coordinate of the identified first electrodes.

9. The capacitive sensor according to claim 6, wherein if the deciding means decides that the manipulating body is also positioned on a top of the second electrode or third electrode besides the plurality of first electrodes according to the capacitances detected for the second electrode and third electrode, the deciding means decides that the number of manipulating bodies is 1.

10. The capacitive sensor according to claim 9, wherein if the deciding means decides that the manipulating body is also positioned on the top of the second electrode or third electrode besides first electrodes, the deciding means identifies, from the plurality of first electrodes, second electrode, and third electrode, an electrode a capacitance of which is equal to or larger than a fifth threshold, and calculates a barycentric coordinate according to a position of the identified electrode.

11. The capacitive sensor according to claim 5, wherein if the sum is smaller than the third threshold, the deciding means decides the direction in which the manipulating body is positioned according to the capacitance detected for the each of the plurality of first electrodes.

12. The capacitive sensor according to claim 1, wherein the plurality of first electrodes have the same shape and are placed in a circumferential direction at equal intervals.

13. The capacitive sensor according to claim 1, wherein the deciding means decides a motion of the manipulating body according to a time-dependent change in the capacitance detected for the each of the plurality of first electrodes.

* * * * *